(12) United States Patent
Frayer et al.

(10) Patent No.: US 9,367,246 B2
(45) Date of Patent: Jun. 14, 2016

(54) PERFORMANCE OPTIMIZATION OF DATA TRANSFER FOR SOFT INFORMATION GENERATION

(71) Applicant: SanDisk Enterprise IP LLC, Milpitas, CA (US)

(72) Inventors: Jack Edward Frayer, Boulder Creek, CA (US); Aaron K. Olbrich, Morgan Hill, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 28 days.

(21) Appl. No.: 13/963,444

(22) Filed: Aug. 9, 2013

(65) Prior Publication Data

US 2014/0281044 A1 Sep. 18, 2014

Related U.S. Application Data

(60) Provisional application No. 61/801,463, filed on Mar. 15, 2013.

(51) Int. Cl.
*G06F 3/00* (2006.01)
*G06F 3/06* (2006.01)
(Continued)

(52) U.S. Cl.
CPC ............... *G06F 3/061* (2013.01); *G06F 3/068* (2013.01); *G06F 3/0659* (2013.01); *G06F 11/1048* (2013.01); *H03M 13/3723* (2013.01); *H03M 13/3769* (2013.01); *H03M 13/45* (2013.01)

(58) Field of Classification Search
None
See application file for complete search history.

(56) References Cited

U.S. PATENT DOCUMENTS

| 4,173,737 A | 11/1979 | Skerlos et al. |
| 4,888,750 A | 12/1989 | Kryder et al. |

(Continued)

FOREIGN PATENT DOCUMENTS

| EP | 1 299 800 | 4/2003 |
| EP | 1465203 A1 | 10/2004 |

(Continued)

OTHER PUBLICATIONS

International Search Report and Written Opinion dated Jul. 25, 2014, received in International Patent Application No. PCT/US2014/029453, which corresponds to U.S. Appl. No. 13/963,444, 9 pages (Frayer).

(Continued)

*Primary Examiner* — Henry Tsai
*Assistant Examiner* — Dean Phan
(74) *Attorney, Agent, or Firm* — Morgan, Lewis & Bockius LLP

(57) ABSTRACT

A single command initiates a first read operation and sequence of one or more additional read operations from the same portion of memory. The one or more additional read operations are terminable after the first read operation provides a first plurality of data values that is made available to a requesting device and/or module. In some implementations, the first plurality of data values includes hard information values. Subsequent pluralities of data values are generated from the same portion of memory until a terminating event occurs. In some implementations, until a terminating event occurs, a respective hybrid plurality of data values is generated by combining the latest read plurality of data values with one of a previously generated hybrid plurality of data values and the first plurality of data values. Each hybrid plurality of data values is representative of a corresponding plurality of soft information values.

28 Claims, 5 Drawing Sheets

(51) Int. Cl.
   *G06F 11/10* (2006.01)
   *H03M 13/37* (2006.01)
   *H03M 13/45* (2006.01)

(56) References Cited

U.S. PATENT DOCUMENTS

| | | | |
|---|---|---|---|
| 4,916,652 A | 4/1990 | Schwarz et al. | |
| 5,129,089 A * | 7/1992 | Nielsen | 710/200 |
| 5,270,979 A | 12/1993 | Harari et al. | |
| 5,329,491 A | 7/1994 | Brown et al. | |
| 5,381,528 A * | 1/1995 | Brunelle | 710/56 |
| 5,519,847 A | 5/1996 | Fandrich et al. | |
| 5,530,705 A | 6/1996 | Malone, Sr. | |
| 5,537,555 A | 7/1996 | Landry et al. | |
| 5,551,003 A | 8/1996 | Mattson et al. | |
| 5,636,342 A | 6/1997 | Jeffries | |
| 5,657,332 A | 8/1997 | Auclair et al. | |
| 5,666,114 A | 9/1997 | Brodie et al. | |
| 5,708,849 A | 1/1998 | Coke et al. | |
| 5,765,185 A | 6/1998 | Lambrache et al. | |
| 5,890,193 A | 3/1999 | Chevallier | |
| 5,936,884 A | 8/1999 | Hasbun et al. | |
| 5,943,692 A | 8/1999 | Marberg et al. | |
| 5,946,714 A | 8/1999 | Miyauchi | |
| 5,982,664 A | 11/1999 | Watanabe | |
| 6,000,006 A | 12/1999 | Bruce et al. | |
| 6,006,345 A | 12/1999 | Berry, Jr. | |
| 6,016,560 A | 1/2000 | Wada et al. | |
| 6,018,304 A | 1/2000 | Bessios | |
| 6,044,472 A | 3/2000 | Crohas | |
| 6,070,074 A | 5/2000 | Perahia et al. | |
| 6,119,250 A | 9/2000 | Nishimura et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,260,120 B1 | 7/2001 | Blumenau et al. | |
| 6,295,592 B1 | 9/2001 | Jeddeloh | |
| 6,311,263 B1 | 10/2001 | Barlow et al. | |
| 6,408,394 B1 | 6/2002 | Vander Kamp et al. | |
| 6,412,042 B1 | 6/2002 | Paterson et al. | |
| 6,442,076 B1 | 8/2002 | Roohparvar | |
| 6,449,625 B1 | 9/2002 | Wang | |
| 6,484,224 B1 | 11/2002 | Robins et al. | |
| 6,516,437 B1 | 2/2003 | Van Stralen et al. | |
| 6,564,285 B1 | 5/2003 | Mills et al. | |
| 6,647,387 B1 | 11/2003 | McKean et al. | |
| 6,678,788 B1 | 1/2004 | O'Connell | |
| 6,757,768 B1 | 6/2004 | Potter et al. | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,865,650 B1 | 3/2005 | Morley et al. | |
| 6,871,257 B2 | 3/2005 | Conley et al. | |
| 6,895,464 B2 | 5/2005 | Chow et al. | |
| 6,966,006 B2 | 11/2005 | Pacheco et al. | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 7,020,017 B2 | 3/2006 | Chen et al. | |
| 7,024,514 B2 | 4/2006 | Mukaida et al. | |
| 7,028,165 B2 | 4/2006 | Roth et al. | |
| 7,032,123 B2 | 4/2006 | Kane et al. | |
| 7,043,505 B1 | 5/2006 | Teague et al. | |
| 7,076,598 B2 | 7/2006 | Wang | |
| 7,100,002 B2 | 8/2006 | Shrader | |
| 7,102,860 B2 | 9/2006 | Wenzel | |
| 7,111,293 B1 | 9/2006 | Hersh et al. | |
| 7,126,873 B2 | 10/2006 | See et al. | |
| 7,133,282 B2 | 11/2006 | Sone | |
| 7,155,579 B1 | 12/2006 | Neils et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,275,170 B2 | 9/2007 | Suzuki | |
| 7,295,479 B2 | 11/2007 | Yoon et al. | |
| 7,328,377 B1 | 2/2008 | Lewis et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,533,214 B2 | 5/2009 | Aasheim et al. | |
| 7,546,478 B2 | 6/2009 | Kubo et al. | |
| 7,566,987 B2 | 7/2009 | Black et al. | |
| 7,571,277 B2 | 8/2009 | Mizushima | |
| 7,574,554 B2 | 8/2009 | Tanaka et al. | |
| 7,596,643 B2 | 9/2009 | Merry, Jr. et al. | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,765,454 B2 | 7/2010 | Passint | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,945,825 B2 | 5/2011 | Cohen et al. | |
| 7,954,041 B2 | 5/2011 | Hong et al. | |
| 7,971,112 B2 | 6/2011 | Murata | |
| 7,974,368 B2 | 7/2011 | Shieh et al. | |
| 7,978,516 B2 | 7/2011 | Olbrich et al. | |
| 7,996,642 B1 | 8/2011 | Smith | |
| 8,006,161 B2 | 8/2011 | Lestable et al. | |
| 8,032,724 B1 | 10/2011 | Smith | |
| 8,041,884 B2 | 10/2011 | Chang | |
| 8,042,011 B2 | 10/2011 | Nicolaidis et al. | |
| 8,069,390 B2 | 11/2011 | Lin | |
| 8,190,967 B2 | 5/2012 | Hong et al. | |
| 8,250,380 B2 | 8/2012 | Guyot | |
| 8,254,181 B2 | 8/2012 | Hwang et al. | |
| 8,259,506 B1 | 9/2012 | Sommer et al. | |
| 8,312,349 B2 | 11/2012 | Reche et al. | |
| 8,412,985 B1 | 4/2013 | Bowers et al. | |
| 8,429,436 B2 | 4/2013 | Fillingim et al. | |
| 8,438,459 B2 | 5/2013 | Cho et al. | |
| 8,453,022 B2 | 5/2013 | Katz | |
| 8,627,117 B2 | 1/2014 | Johnston | |
| 8,634,248 B1 | 1/2014 | Sprouse et al. | |
| 8,694,854 B1 | 4/2014 | Dar et al. | |
| 8,724,789 B2 | 5/2014 | Altberg et al. | |
| 8,885,434 B2 | 11/2014 | Kumar | |
| 8,898,373 B1 | 11/2014 | Kang et al. | |
| 8,910,030 B2 | 12/2014 | Goel | |
| 8,923,066 B1 | 12/2014 | Subramanian et al. | |
| 9,043,517 B1 | 5/2015 | Sprouse et al. | |
| 9,128,690 B2 | 9/2015 | Lotzenburger et al. | |
| 2001/0050824 A1 | 12/2001 | Buch | |
| 2002/0024846 A1 | 2/2002 | Kawahara et al. | |
| 2002/0036515 A1 | 3/2002 | Eldridge et al. | |
| 2002/0083299 A1 | 6/2002 | Van Huben et al. | |
| 2002/0116651 A1 | 8/2002 | Beckert et al. | |
| 2002/0122334 A1 | 9/2002 | Lee et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid et al. | |
| 2003/0079172 A1 | 4/2003 | Yamagishi et al. | |
| 2003/0088805 A1 | 5/2003 | Majni et al. | |
| 2003/0093628 A1 | 5/2003 | Matter et al. | |
| 2003/0163594 A1 | 8/2003 | Aasheim et al. | |
| 2003/0163629 A1 | 8/2003 | Conley et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0204341 A1 | 10/2003 | Guliani et al. | |
| 2003/0212719 A1 | 11/2003 | Yasuda et al. | |
| 2003/0225961 A1 | 12/2003 | Chow et al. | |
| 2004/0024957 A1 | 2/2004 | Lin et al. | |

(56) References Cited

U.S. PATENT DOCUMENTS

| | | |
|---|---|---|
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0085849 A1 | 5/2004 | Myoung et al. |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0210706 A1 | 10/2004 | In et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0073884 A1 | 4/2005 | Gonzalez et al. |
| 2005/0108588 A1 | 5/2005 | Yuan |
| 2005/0114587 A1 | 5/2005 | Chou et al. |
| 2005/0138442 A1 | 6/2005 | Keller, Jr. et al. |
| 2005/0154825 A1 | 7/2005 | Fair |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0281088 A1 | 12/2005 | Ishidoshiro et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0103480 A1 | 5/2006 | Moon et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0191993 A1 | 8/2007 | Wyatt |
| 2007/0201274 A1 | 8/2007 | Yu et al. |
| 2007/0204128 A1 | 8/2007 | Lee et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1* | 11/2007 | Cornwell et al. ........ 365/185.03 |
| 2007/0268754 A1 | 11/2007 | Lee et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0052451 A1 | 2/2008 | Pua et al. |
| 2008/0056005 A1* | 3/2008 | Aritome .................. 365/185.21 |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0115206 A1 | 5/2010 | de la Iglesia et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |

(56) References Cited

U.S. PATENT DOCUMENTS

| | | |
|---|---|---|
| 2010/0199027 A1 | 8/2010 | Pucheral et al. |
| 2010/0199125 A1 | 8/2010 | Reche |
| 2010/0199138 A1* | 8/2010 | Rho .......................... 714/746 |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0306222 A1 | 12/2010 | Freedman et al. |
| 2010/0332858 A1 | 12/2010 | Trantham et al. |
| 2011/0010514 A1 | 1/2011 | Benhase et al. |
| 2011/0022819 A1 | 1/2011 | Post et al. |
| 2011/0051513 A1 | 3/2011 | Shen et al. |
| 2011/0066597 A1 | 3/2011 | Mashtizadeh et al. |
| 2011/0066806 A1 | 3/2011 | Chhugani et al. |
| 2011/0072302 A1 | 3/2011 | Sartore |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1* | 7/2011 | Hsiao .......................... 711/206 |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2011/0320733 A1 | 12/2011 | Sanford et al. |
| 2012/0011393 A1 | 1/2012 | Roberts et al. |
| 2012/0017053 A1 | 1/2012 | Yang et al. |
| 2012/0023144 A1 | 1/2012 | Rub |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0117397 A1 | 5/2012 | Kolvick et al. |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239868 A1 | 9/2012 | Ryan et al. |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0038380 A1 | 2/2013 | Cordero et al. |
| 2013/0047045 A1 | 2/2013 | Hu et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |
| 2013/0124792 A1 | 5/2013 | Melik-Martirosian et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194865 A1 | 8/2013 | Bandic et al. |
| 2013/0194874 A1 | 8/2013 | Mu et al. |
| 2013/0232289 A1 | 9/2013 | Zhong et al. |
| 2013/0238576 A1 | 9/2013 | Binkert et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0297613 A1 | 11/2013 | Yu |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2013/0346672 A1 | 12/2013 | Sengupta et al. |
| 2014/0013188 A1 | 1/2014 | Wu et al. |
| 2014/0032890 A1 | 1/2014 | Lee et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082456 A1 | 3/2014 | Li et al. |
| 2014/0095775 A1 | 4/2014 | Talagala et al. |
| 2014/0122818 A1 | 5/2014 | Hayasaka et al. |
| 2014/0122907 A1 | 5/2014 | Johnston |
| 2014/0136762 A1 | 5/2014 | Li et al. |
| 2014/0136883 A1 | 5/2014 | Cohen |
| 2014/0136927 A1 | 5/2014 | Li et al. |
| 2014/0143505 A1 | 5/2014 | Sim et al. |
| 2014/0181458 A1 | 6/2014 | Loh et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0310494 A1 | 10/2014 | Higgins et al. |
| 2014/0359381 A1 | 12/2014 | Takeuchi et al. |
| 2015/0023097 A1 | 1/2015 | Khoueir et al. |
| 2015/0037624 A1 | 2/2015 | Thompson et al. |
| 2015/0153799 A1 | 6/2015 | Lucas et al. |
| 2015/0153802 A1 | 6/2015 | Lucas et al. |

FOREIGN PATENT DOCUMENTS

| | | |
|---|---|---|
| EP | 1 990 921 A2 | 11/2008 |
| EP | 2 386 958 A1 | 1/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

International Search Report and Written Opinion dated Mar. 7, 2014, received in International Patent Application No. PCT/US2013/

(56) References Cited

OTHER PUBLICATIONS 074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Barr, Introduction to Watchdog Timers, Oct. 2001, 3 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
McLean, Information Technology-AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report/Written Opinion, PCT/US08/88133, Mar. 19, 2009, 7 pgs.
Pliant Technology, International Search Report/Written Opinion, PCT/US08/88136, Mar. 19, 2009, 7 pgs.
Pliant Technology, International Search Report/Written Opinion, PCT/US08/88146, Feb. 26, 2009, 10 pgs.
Pliant Technology, International Search Report/Written Opinion, PCT/US08/88154, Feb. 27, 2009, 8 pgs.
Pliant Technology, International Search Report/Written Opinion, PCT/US08/88164, Feb. 13, 2009, 6 pgs.
Pliant Technology, International Search Report/Written Opinion, PCT/US08/88206, Feb. 18, 2009, 8 pgs.
Pliant Technology, International Search Report/Written Opinion, PCT/US08/88217, Feb. 19, 2009, 7 pgs.
Pliant Technology, International Search Report/Written Opinion, PCT/US08/88229, Feb. 13, 2009, 7 pgs.
Pliant Technology, International Search Report/Written Opinion, PCT/US08/88232, Feb. 19, 2009, 8 pgs.
Pliant Technology, International Search Report/Written Opinion, PCT/US08/88236, Feb. 19, 2009, 7 pgs.
Pliant Technology, International Search Report/Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report/Written Opinion, PCT/US2012/042764, Aug. 31, 2012, 12 pgs.
SanDisk Enterprise IP LLC, International Search Report/Written Opinion, PCT/US2012/042771, Mar. 4, 2013, 14 pgs.
SanDisk Enterprise IP LLC, International Search Report/Written Opinion, PCT/US2012/042775, Sep. 26, 2012, 8 pgs.
SanDisk Enterprise IP LLC, International Search Report/Written Opinion, PCT/US2012/059447, Jun. 6, 2013, 12 pgs.
SanDisk Enterprise IP LLC, International Search Report/Written Opinion, PCT/US2012/059453, Jun. 6, 2013, 12 pgs.
Sandisk Enterprise IP LLC, International Search Report/Written Opinion, PCT/US2012/059459, Feb. 14, 2013, 9 pgs.
SanDisk Enterprise IP LLC, International Search Report/Written Opinion, PCT/US2012/065914, May 23, 2013, 7 pgs.
SanDisk Enterprise IP LLC, International Search Report/Written Opinion, PCT/US2012/065916, Apr. 5, 2013, 7 pgs.
SanDisk Enterprise IP LLC, International Search Report/Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
Invitation to Pay Additional Fees dated Feb. 13, 2015, received in international Patent Application No. PCT/US2014/063949, which corresponds to U.S. Appl. No. 14/135,433 6 pages (Delpapa).
International Search Report and Written Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,260, 13 pages (Fitzpatrick).
Canim, Buffered Bloom ilters on Solid State Storage, ADMS*10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
Ashkenazi et al., "Platform independent overall security architecture in multi-processor system-on-chip integrated circuits for use in mobile phones and handheld devices," ScienceDirect, Computers and Electrical Engineering 33 (2007), 18 pages.
Lee et al., "A Semi-Preemptive Garbage Collector for Solid State Drives," Apr. 2011, IEEE, pp. 12-21.
Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015, received in international Patent Application No. PCT/US2014/065987, which corresponds to U.S. Appl. No. 14/135,400, 12 pages (George).
International Search Report and Written Opinion dated Mar. 17, 2015, received in International Patent Application No. PCT/US2014/067467, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Delpapa).
International Search Report and Written Opinion dated Mar. 9, 2015, received in International Patent Application No. PCT/US2014/059747, which corresponds to U.S. Appl. No. 14/137,440, 9 pages (Fitzpatrick).
Bayer, "Prefix B-Trees", ip.com Journal, ip.com Inc., West Henrietta, NY, Mar. 30, 2007, 29 pages.
Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.
Oracle, "Oracle9i: Database Concepts", Jul. 2001, http://docs.oracle.com/cd/A91202_01/901_doc/server.901/a88856.pdf, 49 pages.
International Search Report and Written Opinion dated Jun. 8, 2015, received in International Patent Application No. PCT/US2015/018252, which corresponds to U.S. Appl. No. 14/339,072, 9 pages (Busch).
International Search Report and Written Opinion dated Jun. 2, 2015, received in International Patent Application No. PCT/US2015/

(56) References Cited

OTHER PUBLICATIONS 018255, which corresponds to U.S. Appl. No. 14/336,967, 14 pages (Chander).

International Search Report and Written Opinion dated Jun. 30, 2015, received in International Patent Application No. PCT/US2015/023927, which corresponds to U.S. Appl. No. 14/454,687, 11 pages (Kadayam).

International Search Report and Written Opinion dated Jul. 23, 2015, received in International Patent Application No. PCT/US2015/030850, which corresponds to U.S. Appl. No. 14/298,843, 12 pages (Ellis).

Gasior, "Gigabyte's i-Ram storage device, Ram disk without the fuss," The Tech Report, p. 1, Jan. 25, 2006, 5 pages.

IBM Research-Zurich, "The Fundamental Limit of Flash Random Write Performance: Understanding, Analysis and Performance Modeling," Mar. 31, 2010, pp. 1-15.

International Search Report and Written Opinion dated Sep. 14, 2015, received in International Patent Application No. PCT/US2015/036807, which corresponds to U.S. Appl. No. 14/311,152, 9 pages (Higgins).

Oestreicher et al., "Object Lifetimes in Java Card," 1999, USENIX, 10 pages.

\* cited by examiner

PERFORMANCE OPTIMIZATION OF DATA TRANSFER FOR SOFT INFORMATION GENERATION

RELATED APPLICATIONS

This application claims priority to U.S. Provisional Patent Application 61/801,463, filed Mar. 15, 2013, which is hereby incorporated by reference in its entirety.

TECHNICAL FIELD

This disclosure relates to error control in memory systems, and in particular, to managing data that is used for soft information error control decoding.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

A drawback of increasing storage density is that the stored data is increasingly prone to being stored and/or read erroneously. An error control coding (ECC) engine is utilized to limit the number of uncorrectable errors that are introduced by electrical fluctuations, defects in the storage medium, operating conditions, device history, and/or write-read circuitry, etc. Additionally, for many error control codes, the decoding process can be improved by using soft information, which takes into account the associated probabilities of different interpretations of the results of one or more read operations. Hard information decoding generally means that an absolute decision is made as to whether a data value is one value or another. By contrast, soft information includes the probabilities that different interpretations of sensed electrical signals, corresponding to the results of one or more read operations, may be correct. By taking into consideration more information, soft information decoding often improves the error detection and correction capability of a particular error control code, and thus the data storage capacity of a system. However, the utilization of soft information decoding has a number of previously irresolvable drawbacks. For example, soft information decoding implementations tend to introduce undesirable delays (i.e., latencies), have relatively large semiconductor footprints, and are generally power and memory intensive.

SUMMARY

Various implementations of systems, methods and devices within the scope of the appended claims each have several aspects, no single one of which is solely responsible for the attributes described herein. In one aspect, a single command initiates a first read operation and sequence of one or more additional read operations from the same portion of memory. This facilitates timely production of hard and then soft information values representative of data stored in a storage medium.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
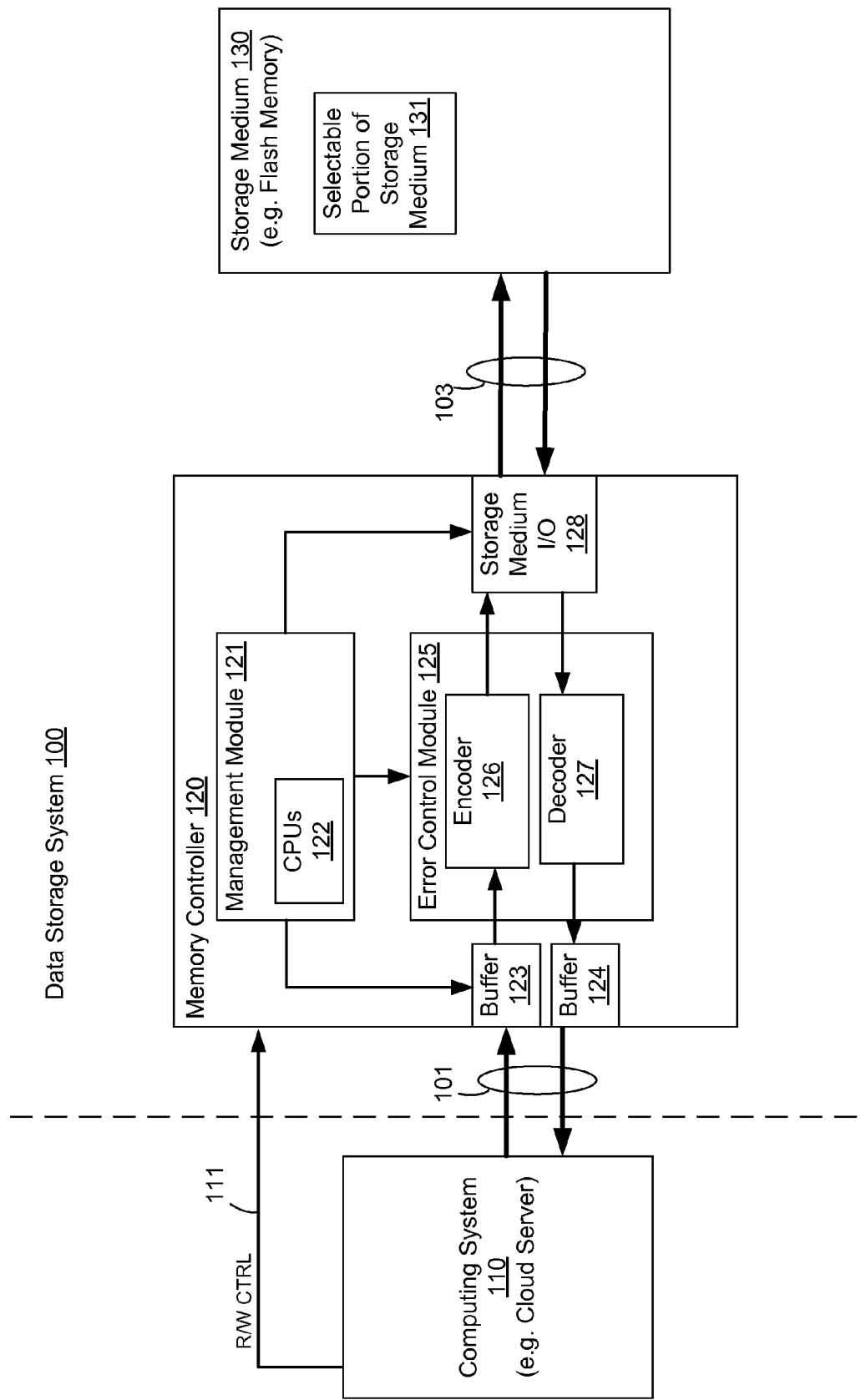
FIG. 1 is a diagram of an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

As noted above, a drawback to employing soft information decoding is that previously available efforts tend to introduce undesirable delays (i.e., latencies), have relatively large semiconductor footprints, and are generally power and memory intensive. By contrast, the various implementations described herein provide a command structure and method of operation responsive to the command structure that facilitates timely production of hard and then soft information values representative of data stored in a storage medium.

Some implementations include a command structure that initiates a first read operation and then a sequence of one or more additional read operations from the same portion of memory as the first read operation. The one or more additional read operations are terminable after the first read operation provides a first plurality of data values, and the first plurality of data values is made available to a requesting device and/or module. In some implementations, the first plurality of data values includes hard information values. Subsequent pluralities of data values are generated by the subsequent read operations until a terminating event occurs. In some implementations, so long as performance of the one or more additional read operations has not been terminated, in response to the completion of each of the one or more additional read operations, a respective hybrid plurality of data values is generated by combining the latest read plurality of data values with one of a previously generated hybrid plurality of data values and the first plurality of data values. As used in the present disclosure, a hybrid plurality of data values is representative of a corresponding plurality of soft information values produced from two or more read operations from the same portion of memory.

More specifically, some implementations include a method for reading from a storage medium. In some implementations, the method includes receiving from a requesting device a control command of a first type. The method further includes responding to receiving the control command of the first type by (1) performing a first read operation, using a first reading signal value, to obtain a first plurality of data values from a portion of the storage medium, (2) after performing the first read operation, initiating performance of one or more additional read operations, each additional read operation using a respective reading signal value different from the first reading signal value to obtain a subsequent plurality of data values from the same portion of the storage medium as the first read operation, and (3) terminating performance of the one or more additional read operations upon the earlier of completion of a predefined number of the additional read operations and receiving a subsequent control command.

In some embodiments, the subsequent control command is of a type that causes termination of the one or more additional read operations.

In some embodiments, the method further includes storing the first plurality of data values in a buffer, transferring the first plurality of data values from the buffer to the requesting device, and initiating performance of a first additional read operation of the one or more additional read operations during a time period that overlaps with the transfer of the first plurality of data values from the buffer to the requesting device.

In some embodiments, the method further includes storing the first plurality of data values in a buffer, setting a status bit that is configured for reading by the requesting device, and initiating performance of a first additional read operation of the one or more additional read operations at a time period proximate to a time that the status bit is set.

In some embodiments, so long as performance of the one or more additional read operations has not been terminated, the method includes generating, in response to a completion of each of the one or more additional read operations, a respective hybrid plurality of data values by combining the latest read plurality of data values with one of a previously generated hybrid plurality of data values and the first plurality of data values.

In some embodiments, the method further includes receiving from a requesting device a control command of a second type, wherein the second type differs from the first type by indicating a request for a single read of a respective portion of the storage medium. The method further includes responding to receiving the control command of the second type by (1) performing a single read operation to obtain data values from a portion of the storage medium, (2) storing the obtained data values in a buffer, and (3) transferring the obtained data values from the buffer to the requesting device.

In some embodiments, the one or more additional read operations is limited to a predefined number of read operations.

In some embodiments, initiating performance of one or more additional read operations occurs in response to a first condition. In some embodiments, the first condition includes receiving a message indicating that the first plurality of data values could not be decoded. In some embodiments, the first condition includes determining that a message, that indicates that the first plurality of data values can be decoded successfully, has not been received within a first duration. In some embodiments, the first condition includes determining that a message, that indicates that the first plurality of data values has been successfully decoded, has not been received within a first duration.

In some embodiments, the method further includes storing the first plurality of data values in a buffer, and transmitting a first message indicating that the first plurality of data values is available to be read from the buffer.

In some embodiments, the method further includes storing each respective hybrid plurality of data values in the buffer by overwriting any previously generated hybrid plurality of data values stored in the buffer, and transmitting a subsequent message indicating that a new hybrid plurality of data values is available to be read from the buffer each time a hybrid plurality of data values is newly stored in the buffer.

In some embodiments, generating each respective hybrid plurality of data values includes an exclusive-or (XOR) between each of the latest read of the one or more subsequent pluralities of data values and one of a previously generated hybrid plurality of data values and the first plurality of data values.

In another aspect, a device operable to read from a storage medium is configured to read data in accordance with any of the methods described above.

In some implementations, with respect to any of the methods described above, a device operable to read from a storage medium includes a storage medium and a controller configured to read data in accordance with any of the methods described above.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, data storage system 100 includes a memory controller 120, and a storage medium 130, and is used in conjunction with computer system 110. In some implementations, storage medium 130 is a single flash memory device while in other implementations storage medium 130 includes a plurality of flash memory devices. In some implementations, storage medium 130 is NAND-type flash memory or NOR-type flash memory. Further, in some implementations memory controller 120 is a solid-state drive (SSD) controller. However, other types of storage media may be included in accordance with aspects of a wide variety of implementations.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a trackpad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, memory controller 120 and storage medium 130 are included in the same device as components thereof. Furthermore, in some implementations memory controller 120 and storage medium 130 are embedded in a host device, such as a mobile device, tablet, other computer or computer controlled device. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages, or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more CPUs 122 are shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

In some implementations, the memory cell voltage of a memory cell is read indirectly, by reading the memory cell using one or more reading threshold voltages. More specifically, each read operation produces a result that indicates whether the cell voltage of the memory cell is greater than or less than the reading threshold voltage used during that read operation. By reading the memory cell using multiple reading threshold voltages, the cell voltage can be determined more precisely than if the memory cell were read using only a single reading threshold voltage. Stated another way, the more read operations that are performed on a memory cell, each using a different reading threshold voltage, the more precisely the cell voltage of the memory cell is known.

Figure 2:
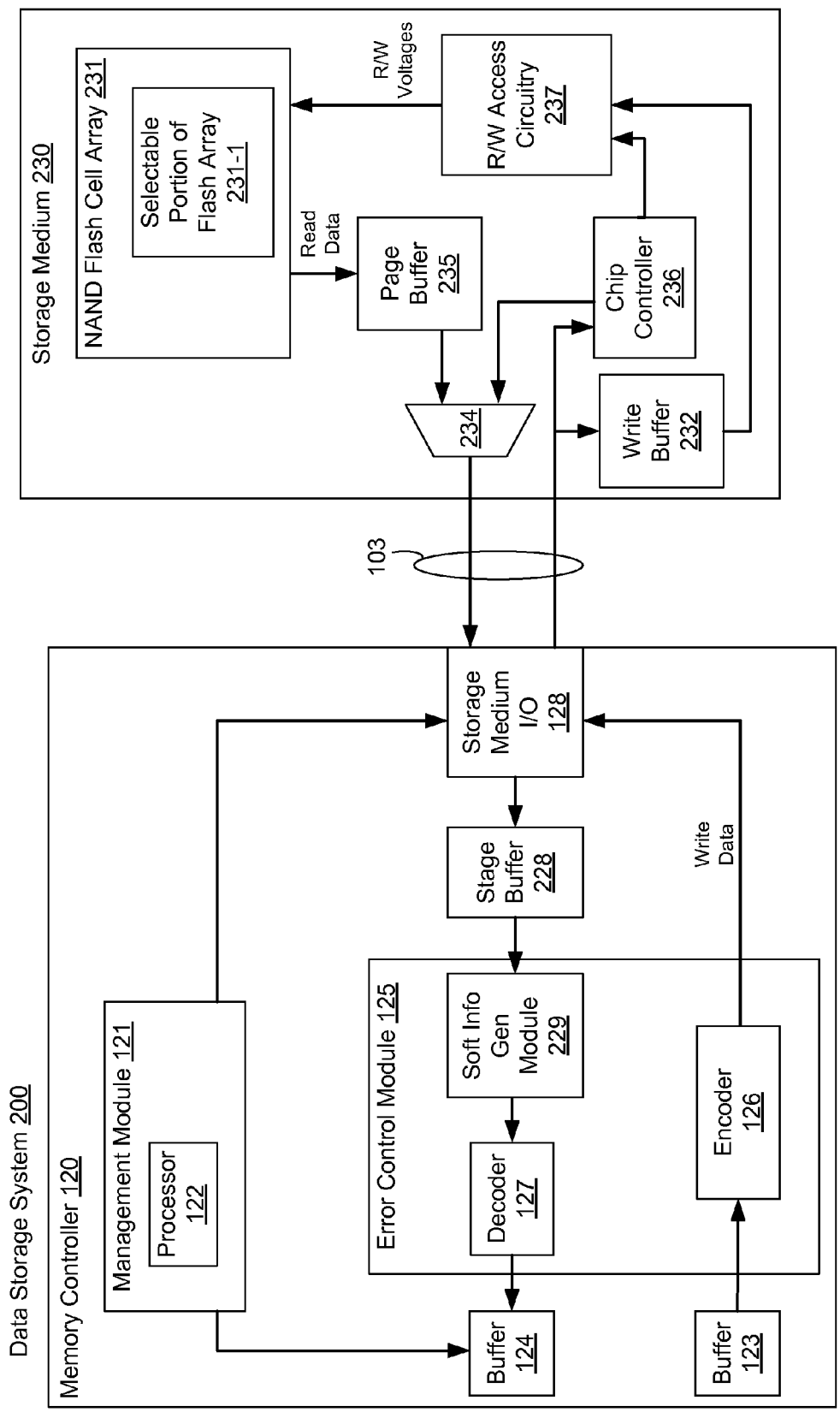
FIG. 2 is a diagram of an implementation of a data storage system, including elements operable to produce soft information responsive to a command structure that facilitates timely production of hard and then soft information values from multiple read operations, in accordance with some embodiments.

FIG. 2 is a diagram of an implementation of a data storage system 200, including elements operable to produce soft information responsive to a command structure that facilitates timely production of hard and then soft information values from multiple read operations. Data storage system 200 illustrated in FIG. 2 is similar to and adapted from data storage system 100 illustrated in FIG. 1. Elements common to each include common reference numbers, and only the differences between FIGS. 1 and 2 are described herein for the sake of brevity. Moreover, while certain specific features are illustrated, various other features have not been illustrated for the sake of brevity and so as not to obscure more pertinent aspects of the example implementations disclosed herein.

With reference to FIG. 2, as a non-limiting example, storage medium 230 generally comprises a memory chip. Those skilled in the art will appreciate from the present disclosure that, in various other implementations, storage medium 230 includes various other types of memory devices, including two or more memory chips. Storage medium 230 includes a NAND flash cell array 231, a write buffer 232, a chip controller 236, read-write (R/W) access circuitry 237, a page buffer 235, and a multiplexer (MUX) 234.

Storage medium I/O 128 is coupled to storage medium 230 through connections 103. Connections 103 are sometimes called data connections, but typically convey commands in addition to data, and optionally convey metadata, error correction information and/or other information in addition to data values to be stored in storage medium 130 and data values read from storage medium 230. More specifically, with continued reference to FIG. 2, storage medium I/O 128 is coupled to deliver write data to write buffer 232, and also coupled to chip controller 236 to convey at least one of commands, metadata and representations of one or more reading signal values (e.g., reading threshold voltages). Chip controller 236 is coupled to provide control commands, including read and write commands, to R/W access circuitry 237. R/W access circuitry 237 is also coupled to receive (or retrieve) write data from write buffer 232.

R/W access circuitry 237 is also coupled to NAND flash cell array 231. During a write operation, R/W access circuitry 237 operates to write data from write buffer 232 into a selectable portion of NAND flash cell array 231, such as for example, selectable portion of flash array 231-1. During a read operation, R/W access circuitry 237 operates to read data stored in NAND flash cell array 231. Read data is copied into page buffer 235. Storage medium I/O 128 is also coupled to receive read data (as either hard or soft information values) through MUX 234. Data read from the NAND flash cell array 231 is stored in page buffer 235, and is made accessible to storage medium I/O 128 through MUX 234. Chip controller 236 provides a control signal to MUX 234 that allows the storage medium I/O 128 to access the read data in page buffer 235 through MUX 234. In turn, storage medium I/O 128 stores read data from buffer 235 in stage buffer 228.

Figure 3:
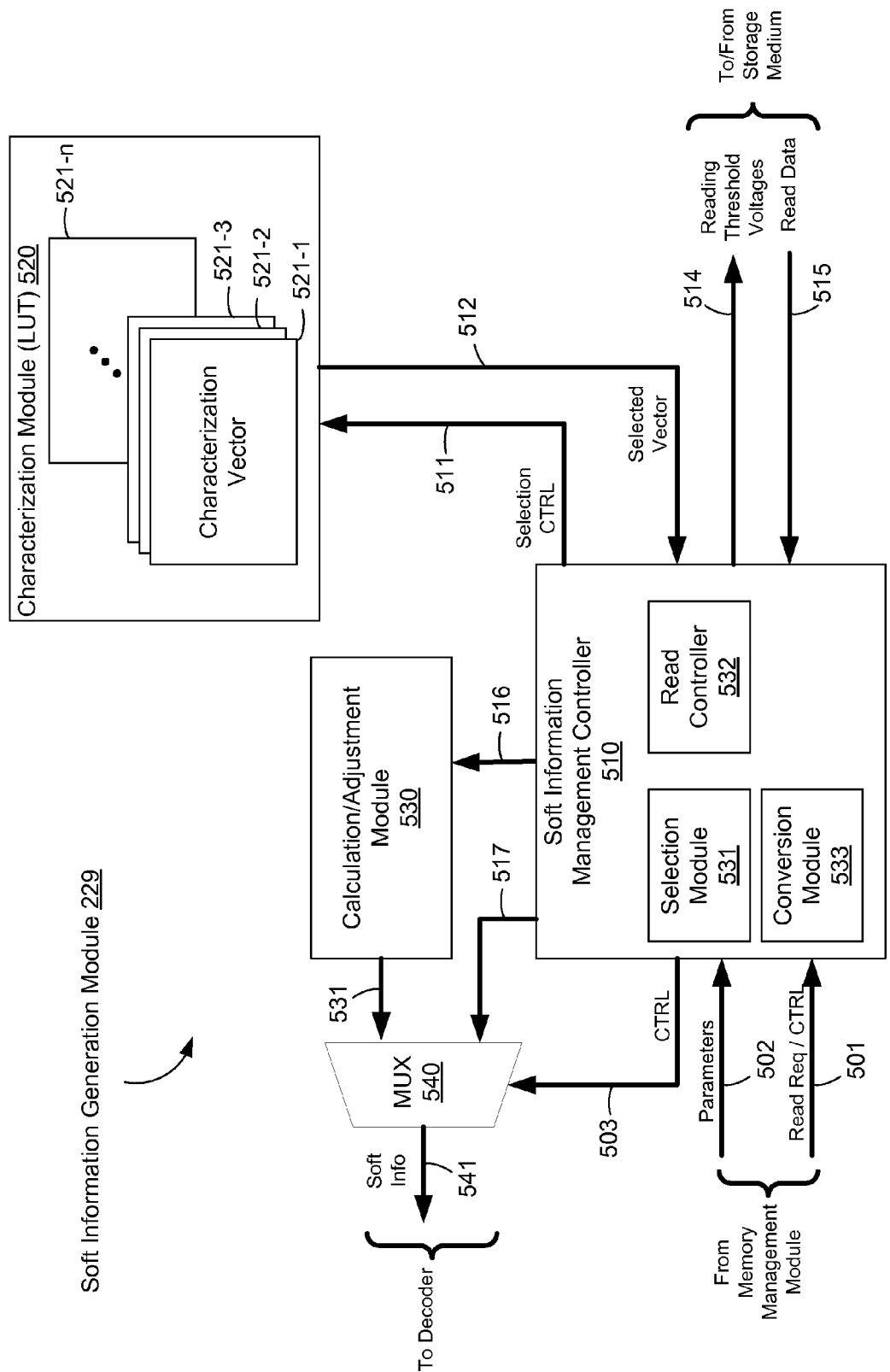
FIG. 3 is a diagram of an implementation of the soft information generation module included in FIG. 2, in accordance with some embodiments.

FIG. 3 is a diagram of an implementation of soft information generation module 229 included in FIG. 2, in accordance with some embodiments. Again, as noted above, while certain specific features are illustrated, those skilled in the art will appreciate from the present disclosure that various other features have not been illustrated for the sake of brevity and so as not to obscure more pertinent aspects of the example implementations disclosed herein. To that end, as a non-limiting example, the soft information generation module 229 includes a soft information management controller 510, a characterization module 520, a calculation/adjustment module 530, and an output multiplex (MUX) 540. Soft information generation module 229 is coupled to decoder 127.

The soft information management controller 510 is coupled to each of the characterization module 520, calculation/adjustment module 530, and MUX 540 in order to coordinate the operation of soft information generation module 229. More specifically, in some implementations, soft information management controller 510 is connected to receive a read request and one or more storage medium characterization parameters on control and data lines 501 and 502, respectively. Soft information management controller 510 is also connected to provide characterization module 520 a selection control signal on control line 511, and to receive a selected characterization vector on data line 512. In some implementations, soft information management controller 510 is further connected to provide reading threshold voltages to the storage medium I/O 128 via data line 514, and to receive raw read data from the storage medium I/O 128 on data line 515 by way of page buffer 235 (FIG. 2) and multiplexer 234 (FIG. 2). Soft information management controller 510 is also connected to provide sequences of soft information values to the calculation/adjustment module 530 and output MUX 540 via corresponding data lines 516 and 517, and a control signal to output MUX 540 via control line 503. Output MUX 540 is also connected to receive adjusted soft information values from calculation/adjustment module 530 on data line 531. Output MUX 540 is connected to selectively provide soft information values from one of conversion module 533 and calculation/adjustment module 530 on data line 541 depending on the control signal received on control line 503.

Characterization module 520 includes a collection of characterization vectors 521-1, 521-2, 521-3, . . . 521-n, that each store characterization data, such as soft information values for bit-tuples and read comparison signal values, associated with storage medium 130 for one or more storage medium characterization parameter values. In some implementations, the characterization data stored in the characterization vectors 521 is statistically derived. Each combination of storage medium characterization parameter values represents a respective state of a storage medium that may be characterized in a device characterization process, and may exist for other devices produced by the same manufacturing process Soft information management controller 510 includes a selection module 531, an optional read controller 532, and a conversion module 533. Selection module 531 is configured to use the one or more storage medium characterization parameters values to select a characterization vector from the stored collection of characterization vectors 521-1, 521-2, 521-3, . . . 521-n in accordance with the current state of storage medium 130. The selection control signal includes one or more of storage medium characterization parameters values and/or an index key associated with a combination of one or more storage medium characterization parameters values that enables characterization module 520 to select a characterization vector based on the one or more storage medium characterization parameters values associated with the current state of the storage medium 130.

Optional read controller 532 is configured to read a portion of the storage medium 130 via storage medium I/O 128. In some implementations, read controller 532 is configured to provide storage medium I/O 128 with read comparison signal values for the read operation. In some implementations, read controller 532 selects one or more statistically determined read comparison signal values from a characterization vector selected based on the one or more storage medium characterization parameter values associated with the current state of storage medium 130.

Conversion module 533 is configured to generate a sequence of soft information values corresponding to raw hard-decision read data. The sequence of soft information values is generated, at least in part, by selecting a respective soft information value from the selected characterization vector for each bit-tuple of the raw hard-decision read data produced by a read operation using a corresponding reading threshold voltage value. More specifically, in some implementations, the conversion module 533 assigns at least one soft information value, in the form of a LLR, to each bit-tuple in the hard-decision read data to produce a corresponding sequence of LLRs $y_{LLR}=(y_1, y_2, \ldots, y_{n-1})$, where n is the codeword length.

Calculation/adjustment module 530 is configured to optionally adjust soft information values in response to one or more characterization parameter values associated with a current state of the storage medium and/or previously detected error characterizations.

Figure 4:
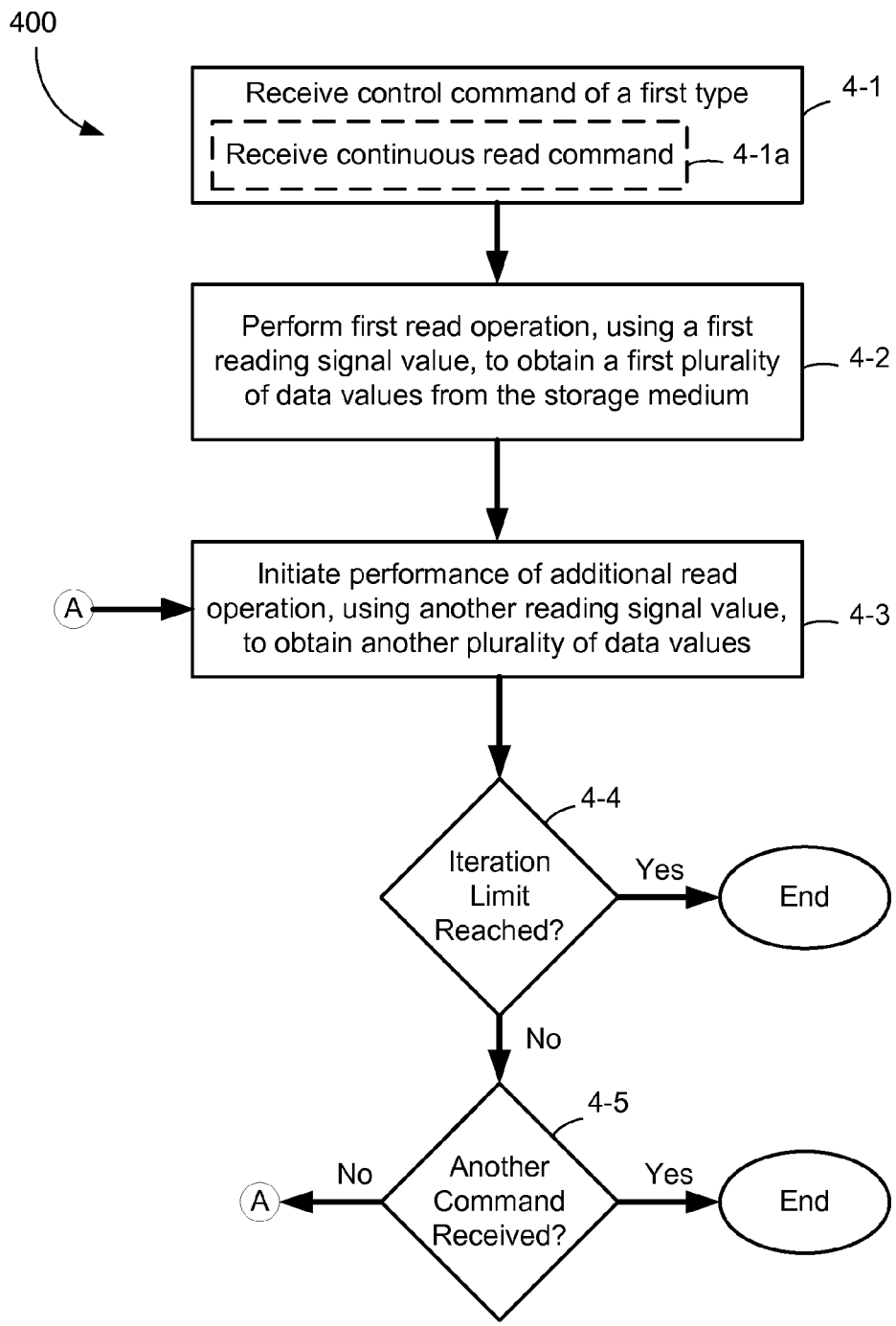
FIG. 4 is a flowchart representation of an implementation of a method of delivering read data as hard and then soft information values responsive to a command structure that facilitates timely production of hard and soft information from multiple read operations, in accordance with some embodiments.

FIG. 4 is a flowchart representation of an implementation of a method 400 of delivering read data as hard and then soft information values responsive to a command structure that facilitates timely production of hard and then soft information values from multiple read operations. In some implementations, method 400 is performed by a chip controller associated with a memory cell array, such as chip controller 236 (shown in FIG. 2). Briefly, method 400 includes responding to receiving a control command of a first type by initiating a first read operation and then a sequence of one or more additional read operations from the same portion of memory as the first read operation. The additional read operations are terminable after a first plurality of data values is provided to the requesting device.

To that end, as represented by block 4-1, method 400 includes receiving from a requesting device a control command of a first type. As represented by block 4-1a, the control command of the first type instructs a receiving device to initiate a first read operation and then a sequence of one or more additional read operations from the same portion of memory as the first read operation. In other words, the control command of the first type is a continuous read command. For example, with reference to FIGS. 2 and 4, chip controller 236 receives a continuous read command transmitted from storage medium I/O 128.

As represented by block 4-2, method 400 includes, responding to receiving the control command of the first type by performing a first read operation, using a first reading signal value (e.g., reading threshold voltage), to obtain a first plurality of data values from a portion of the storage medium. For example, with continued reference to FIGS. 2 and 4, chip controller 236 provides a first read command and a first reading threshold voltage to R/W access circuitry 237. R/W access circuitry 237 operates to read a first plurality of data from NAND flash cell array 231. First plurality of data values read from NAND flash cell array 231 is copied into page buffer 235.

As represented by block 4-3, after performing the first read operation, method 400 includes further responding to receiving the control command of the first type by initiating performance of one or more additional read operations, each additional read operation using a respective reading signal value different from the first reading signal value to obtain a subsequent plurality of data values from the same portion of the storage medium as the first read operation. For example, with continued reference to FIGS. 2 and 4, chip controller 236 iteratively provides subsequent read commands and respective subsequent reading threshold voltages to R/W access circuitry 237. In response to receiving each subsequent read command and the respective subsequent reading threshold voltage, R/W access circuitry 237 operates to read a respective subsequent plurality of data from NAND flash cell array 231. Each respective subsequent plurality of data values read from NAND flash cell array 231 is copied into page buffer 235.

Additionally, in some implementations, initiating performance of one or more additional read operations occurs in response to a first condition. In some implementations, the first condition includes receiving a message indicating that the first plurality of data values could not be decoded. In some implementations, the first condition includes determining that a message, that indicates that the first plurality of data values can be decoded successfully, has not been received within a first duration. In some implementations, the first condition includes determining that a message, that indicates that the first plurality of data values has been successfully decoded, has not been received within a first duration.

As represented by block 4-4, method 400 includes determining whether an iteration limit has been reached. In some implementations, the iteration limit defines a limit on the number of one or more additional read operations that are performed in response to the control command of the first type. As such, the one or more additional read operations is limited to a predefined number of read operations. If the iteration limit has been reached ("Yes" path from block 4-4), method 400 terminates. On the other hand, if the iteration limit has not been reached ("No" path from block 4-4), as represented by block 4-5, method 400 includes determining if another command has been received. If another command has been received ("Yes" path from block 4-5), method 400 terminates. On the other hand, if another command has not been received ("No" path from block 4-4), method 400 loops back to the portion of the method represented by block 4-3 so that subsequent read operations can be performed as described. In some implementations, the subsequent control command is of a type that causes termination of the one or more additional read operations. In some implementations, any subsequently received control command signals the termination of the one or more additional read operations.

In some implementations, as represented by the combination of blocks 4-4 and 4-5, method 400 includes terminating performance of the one or more additional read operations upon the earlier of completion of a predefined number of the additional read operations and receiving a subsequent control command. Moreover, in some implementations, the portions of method 400 represented by blocks 4-4 and 4-5 occur in the opposite order, or simultaneously with respect to one another. In some implementations the portions of method 400 represented by blocks 4-4 and 4-5 also occur simultaneously with the portion of method 400 represented by block 4-3, thereby enabling the one or more additional read operations to be terminable at any time after the first plurality of data values is made available to the requesting device and/or module.

Figure 5:
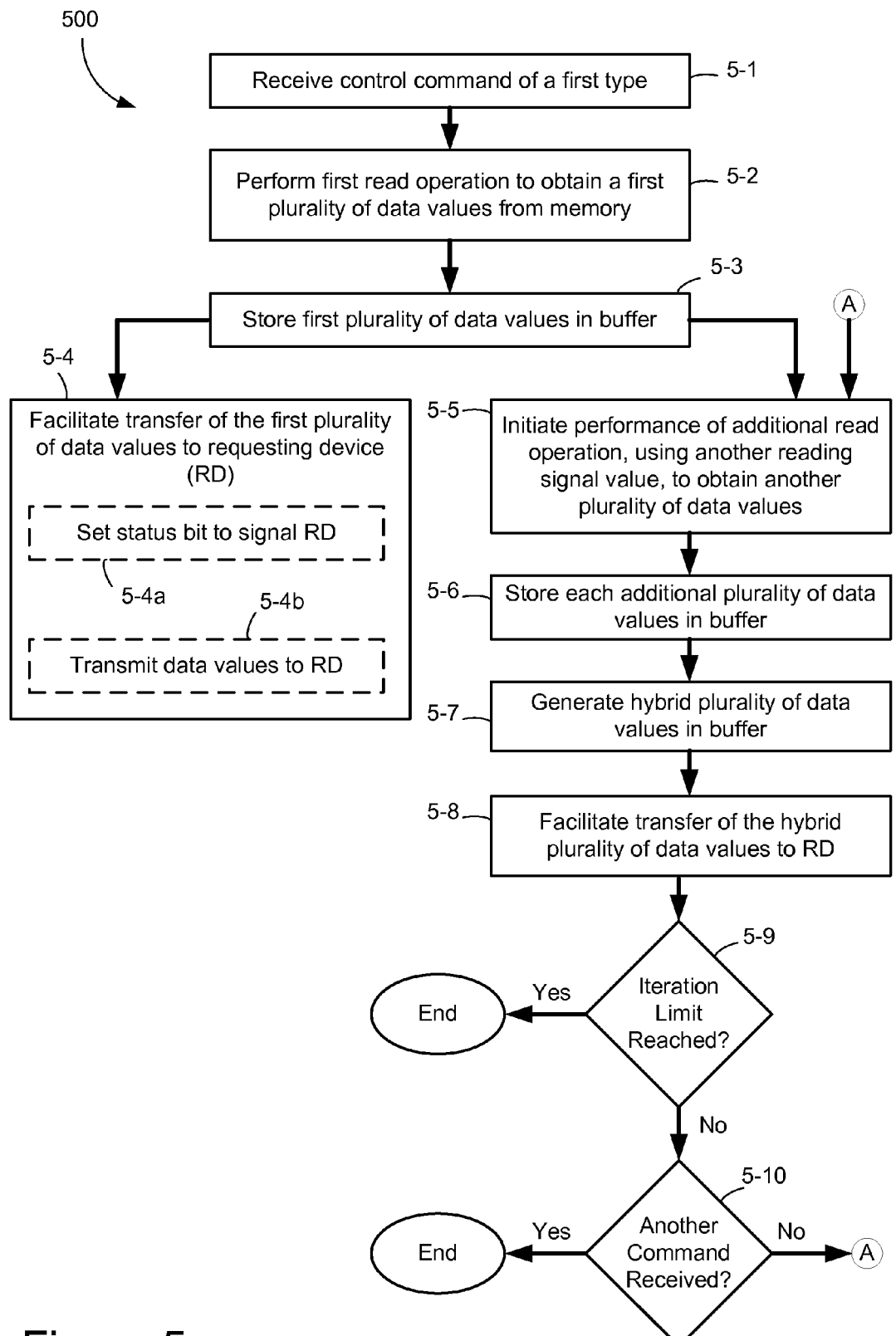
FIG. 5 is a flowchart representation of an implementation of a method of delivering read data as hard and then soft information values responsive to a command structure that facilitates timely production of hard and soft information from multiple read operations, in accordance with some embodiments.

FIG. 5 is a flowchart representation of an implementation of a method 500 of delivering read data as hard and then soft information values responsive to a command structure that facilitates timely production of hard and then soft information values from multiple read operations, in accordance with some implementations. In some implementations, method 500 is performed by a chip controller associated with a memory cell array, such as chip controller 236 (shown in FIG. 2). Briefly, method 500 includes responding to receiving a control command of a first type by initiating a first read operation and then a sequence of one or more additional read operations from the same portion of memory as the first read operation. The additional read operations are terminable after a first plurality of data values is provided to the requesting device.

To that end, as represented by block 5-1, method 500 includes receiving from a requesting device a control command of a first type. In other words, the control command of the first type is a continuous read command. For example, with reference to FIGS. 2 and 5, chip controller 236 receives a continuous read command transmitted from storage medium I/O 128.

As represented by block 5-2, method 500 includes, responding to receiving the control command of the first type by performing a first read operation, using a first reading signal value, to obtain a first plurality of data values from a portion of the storage medium. For example, with continued reference to FIGS. 2 and 5, chip controller 236 provides a first read command and a first reading threshold voltage to R/W access circuitry 237. R/W access circuitry 237 operates to read a first plurality of data from NAND flash cell array 231. First plurality of data values read from NAND flash cell array 231 is copied into page buffer 235.

As represented by block 5-3, method 500 includes storing the first plurality of data values in a buffer. For example, with continued reference to FIGS. 2 and 5, the first plurality of data values read from NAND flash cell array 231 is copied into page buffer 235. From the portion of the method represented by block 5-3, method 500 takes two operational paths that are performed proximate in time to one another and/or simultaneously. Along one path, as represented by block 5-4, method 500 includes facilitating transfer of the first plurality of data values to a requesting device. In some implementations, as represented by block 5-4a, facilitating the transfer of the first plurality of data values to the requesting device includes setting a status bit that is configured for reading by the requesting device. For example, with continued reference to FIGS. 2 and 5, chip controller 236 sets a status bit that is readable by storage medium I/O 128 over connections 103. In some implementations, as represented by block 5-4b, facilitating the transfer of the first plurality of data values to the requesting device includes transferring the first plurality of data values from the buffer to the requesting device. For example, with continued reference to FIGS. 2 and 5, chip controller 236 provides MUX 234 with a drive signal that enables the MUX 234 to push the first plurality of data from page buffer 235 to storage medium I/O 128 in memory controller 120 over connections 103.

Along another path, as represented by block 5-5, after performing the first read operation, method 500 includes further responding to receiving the control command of the first type by initiating performance of an additional read operation using a respective reading signal value different from the first reading signal value to obtain a subsequent plurality of data values from the same portion of the storage medium as the first read operation. For example, with continued reference to FIGS. 2 and 5, chip controller 236 iteratively provides subsequent read commands and respective subsequent reading threshold voltages to R/W access circuitry 237. In response to receiving each subsequent read command and the respective subsequent reading threshold voltage, R/W access circuitry 237 operates to read a respective subsequent plurality of data from NAND flash cell array 231. Each respective subsequent plurality of data values read from NAND flash cell array 231 is copied into page buffer 235. In some implementations, method 500 includes initiating performance of a first additional read operation of the one or more additional read operations during a time period that overlaps with the transfer of the first plurality of data values from the buffer to the requesting device. In some implementations, method 500 includes initiating performance of a first additional read operation of the one or more additional read operations at a time period proximate to a time that the status bit is set.

Additionally, in some implementations, initiating performance of one or more additional read operations occurs in response to a first condition. In some implementations, the first condition includes receiving a message indicating that the first plurality of data values could not be decoded. In some implementations, the first condition includes determining that a message, that indicates that the first plurality of data values can be decoded successfully, has not been received within a first duration. In some implementations, the first condition includes determining that a message, that indicates that the first plurality of data values has been successfully decoded, has not been received within a first duration.

As represented by block 5-6, method 500 includes storing each additional plurality of data values in a buffer. For example, with further reference to FIGS. 2 and 5, each respective subsequent plurality of data values read from NAND flash cell array 231 is copied into page buffer 235. As represented by block 5-7, method 500 includes generating a hybrid plurality of data values in the buffer. In other words, in some implementations, so long as performance of the one or more additional read operations has not been terminated, method 500 includes generating, in response to a completion of each of the one or more additional read operations, a respective hybrid plurality of data values by combining the latest read plurality of data values with one of a previously generated hybrid plurality of data values and the first plurality of data values. In some implementations, method 500 also includes storing each respective hybrid plurality of data values in the buffer by overwriting any previously generated hybrid plurality of data values stored in the buffer. In some implementations, generating each respective hybrid plurality of data values includes an exclusive-or (XOR) between each of the latest read of the one or more subsequent pluralities of data values and one of a previously generated hybrid plurality of data values and the first plurality of data values.

As represented by block 5-8, method 500 includes facilitating transfer of the hybrid plurality of data values to the requesting device. In some implementations, facilitating transfer of the hybrid plurality of data values to the requesting device by transmitting a first message indicating that the first plurality of data values is available to be read from the buffer. In some implementations, facilitating transfer of the hybrid plurality of data values to the requesting device by transmitting a subsequent message indicating that a new hybrid plurality of data values is available to be read from the buffer each time a hybrid plurality of data values is newly stored in the buffer.

As represented by block 5-9, method 500 includes determining whether an iteration limit has been reached. In some implementations, the iteration limit defines a limit on the number of one or more additional read operations that are performed in response to the control command of the first type. If the iteration limit has been reached ("Yes" path from block 5-9), method 500 terminates. On the other hand, if the iteration limit has not been reached ("No" path from block 5-9), as represented by block 5-10, method 500 includes determining if another command has been received. If another command has been received ("Yes" path from block 5-10), method 500 terminates. On the other hand, if another command has not been received ("No" path from block 5-10), method 500 loops back to the portion of the method represented by block 5-5 so that subsequent read operations can be performed as described. In some implementations, the subsequent control command is of a type that causes termination of the one or more additional read operations. In some implementations, any subsequently received control command signals the termination of the one or more additional read operations.

In some implementations, as represented by the combination of blocks 5-9 and 5-10, method 500 includes terminating performance of the one or more additional read operations upon the earlier of completion of a predefined number of the additional read operations and receiving a subsequent control command. Moreover, in some implementations, the portions of method 500 represented by blocks 5-9 and 5-10 occur in the opposite order, or simultaneously with respect to one another. In some implementations the portions of method 500 represented by blocks 5-9 and 5-10 also occur simultaneously with the portion of method 500 represented by block 5-5, thereby enabling the one or more additional read operations to be terminable at any time after the first plurality of data values is made available to the requesting device and/or module.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of reading from a storage medium, the method comprising:
   receiving from a requesting device a control command of a first type;
   responding to receiving the control command of the first type by:
      performing a first read operation, using a first reading signal value, to obtain a first plurality of data values from a portion of the storage medium;
      after performing the first read operation, initiating performance of one or more additional read operations, each additional read operation using a respective reading signal value different from the first reading signal value to obtain a subsequent plurality of data values from the same portion of the storage medium as the first read operation;

in response to receiving a subsequent control command from the requesting device prior to completion of a predefined number of the additional read operations, the receipt of the subsequent control command indicating that the first read operation or one of the additional read operations was successful, terminating performance of the one or more additional read operations; and in response to completion of the predefined number of the additional read operations, terminating performance of the one or more additional read operations.

2. The method of claim 1, wherein the method is performed by circuitry in the storage medium in response to control commands received from a memory controller coupled to the storage medium, and wherein the subsequent control command, from the memory controller, is of a type that causes termination of the one or more additional read operations.

3. The method of claim 1, further comprising:
storing the first plurality of data values in a buffer;
transferring the first plurality of data values from the buffer to the requesting device; and
initiating performance of a first additional read operation of the one or more additional read operations during a time period that overlaps with the transfer of the first plurality of data values from the buffer to the requesting device.

4. The method of claim 1, further comprising:
storing the first plurality of data values in a buffer;
setting a status bit that is configured for reading by the requesting device; and
initiating performance of a first additional read operation of the one or more additional read operations at a time period proximate to a time that the status bit is set.

5. The method of claim 1, wherein so long as performance of the one or more additional read operations has not been terminated, the method includes generating, in response to a completion of each of the one or more additional read operations, a respective hybrid plurality of data values by combining the latest read plurality of data values with one of a previously generated hybrid plurality of data values and the first plurality of data values.

6. The method of claim 1, further comprising:
receiving from a requesting device a control command of a second type, wherein the second type differs from the first type by indicating a request for a single read of a respective portion of the storage medium;
responding to receiving the control command of the second type by:
performing a single read operation to obtain data values from a portion of the storage medium;
storing the obtained data values in a buffer; and
transferring the obtained data values from the buffer to the requesting device.

7. The method of claim 1, wherein the one or more additional read operations is limited to a predefined number of read operations.

8. The method of claim 1, wherein initiating performance of one or more additional read operations occurs in response to a first condition.

9. The method of claim 8, wherein the first condition includes determining that a message, that indicates that the first plurality of data values can be decoded successfully, has not been received within a first duration.

10. The method of claim 8, wherein the first condition includes determining that a message, that indicates that the first plurality of data values has been successfully decoded, has not been received within a first duration.

11. The method of claim 5, further comprising:
storing the first plurality of data values in a buffer; and
transmitting a first message indicating that the first plurality of data values is available to be read from the buffer.

12. The method of claim 11, further comprising:
storing each respective hybrid plurality of data values in the buffer by overwriting any previously generated hybrid plurality of data values stored in the buffer; and
transmitting a subsequent message indicating that a new hybrid plurality of data values is available to be read from the buffer each time a hybrid plurality of data values is newly stored in the buffer.

13. The method of claim 5, wherein generating each respective hybrid plurality of data values includes an exclusive-or (XOR) between each of the latest read of the one or more subsequent pluralities of data values and one of a previously generated hybrid plurality of data values and the first plurality of data values.

14. A device, comprising:
a storage medium; and
control circuitry configured to:
receive from a requesting device a control command of a first type;
respond to receiving the control command of the first type by:
performing a first read operation, using a first reading signal value, to obtain a first plurality of data values from a portion of the storage medium;
after performing the first read operation, initiating performance of one or more additional read operations, each additional read operation using a respective reading signal value different from the first reading signal value to obtain a subsequent plurality of data values from the same portion of the storage medium as the first read operation; and
in accordance with a determination that a subsequent control command has been received from the requesting device prior to completion of a predefined number of the additional read operations, the receipt of the subsequent control command indicating that the first read operation or one of the additional read operations was successful, terminating performance of the one or more additional read operations; and
in accordance with a determination that a subsequent control command has not been received from the requesting device prior to completion of a predefined number of the additional read operations, terminating performance of the one or more additional read operations in accordance with completion of the predefined number of the additional read operations.

15. The device of claim 14, wherein the requesting device is a memory controller coupled to the storage medium, and the subsequent control command, from the memory controller, is of a type that causes termination of the one or more additional read operations.

16. The device of claim 15, wherein the control circuitry is further configured to:
store the first plurality of data values in a buffer;
transfer the first plurality of data values from the buffer to the requesting device; and initiate performance of a first additional read operation of the one or more additional read operations during a time period that overlaps with the transfer of the first plurality of data values from the buffer to the requesting device.

17. The device of claim 14, wherein the control circuitry is further configured to:
store the first plurality of data values in a buffer;
set a status bit that is configured for reading by the requesting device; and
initiate performance of a first additional read operation of the one or more additional read operations at a time period proximate to a time that the status bit is set.

18. The device of claim 14, wherein so long as performance of the one or more additional read operations has not been terminated, the control circuitry generates, in response to a completion of each of the one or more additional read operations, a respective hybrid plurality of data values by combining the latest read plurality of data values with one of a previously generated hybrid plurality of data values and the first plurality of data values.

19. The device of claim 14, wherein the control circuitry is configured to:
receive from the requesting device a control command of a second type, wherein the second type differs from the first type by indicating a request for a single read of a respective portion of the storage medium;
respond to receiving the control command of the second type by:
performing a single read operation to obtain data values from a portion of the storage medium;
storing the obtained data values in a buffer; and
transferring the obtained data values from the buffer to the requesting device.

20. The device of claim 14, wherein the one or more additional read operations is limited to a predefined number of read operations.

21. The device of claim 14, wherein initiating performance of one or more additional read operations occurs in response to a first condition.

22. The device of claim 21, wherein the first condition includes determining that a message, that indicates that the first plurality of data values can be decoded successfully, has not been received within a first duration.

23. The device of claim 21, wherein the first condition includes determining that a message, that indicates that the first plurality of data values has been successfully decoded, has not been received within a first duration.

24. The device of claim 18, wherein the control circuitry is further configured to:
store the first plurality of data values in a buffer; and
transmit a first message indicating that the first plurality of data values is available to be read from the buffer.

25. The device of claim 24, wherein the control circuitry is further configured to:
store each respective hybrid plurality of data values in the buffer by overwriting any previously generated hybrid plurality of data values stored in the buffer; and
transmit a subsequent message indicating that a new hybrid plurality of data values is available to be read from the buffer each time a hybrid plurality of data values is newly stored in the buffer.

26. The device of claim 18, wherein generating each respective hybrid plurality of data values includes an exclusive-or (XOR) between each of the latest read of the one or more subsequent pluralities of data values and one of a previously generated hybrid plurality of data values and the first plurality of data values.

27. A method of reading from a storage medium, the method comprising:
receiving from a requesting device a control command of a first type;
responding to receiving the control command of the first type by:
performing a first read operation, using a first reading signal value, to obtain a first plurality of data values from a portion of the storage medium;
after performing the first read operation, initiating performance of one or more additional read operations, each additional read operation using a respective reading signal value different from the first reading signal value to obtain a subsequent plurality of data values from the same portion of the storage medium as the first read operation;
in accordance with a determination that a subsequent control command has been received from the requesting device prior to completion of a predefined number of the additional read operations, the receipt of the subsequent control command indicating that the first read operation or one of the additional read operations was successful, terminating performance of the one or more additional read operations; and
in accordance with a determination that a subsequent control command has not been received from the requesting device prior to completion of a predefined number of the additional read operations, terminating performance of the one or more additional read operations in accordance with completion of the predefined number of the additional read operations.

28. The method of claim 27, wherein the method is performed by circuitry in the storage medium in response to control commands received from a memory controller coupled to the storage medium, and wherein the subsequent control command, from the memory controller, is of a type that causes termination of the one or more additional read operations.

* * * * *